United States Patent
Kataoka et al.

(10) Patent No.: US 7,176,154 B2
(45) Date of Patent: Feb. 13, 2007

(54) CERAMIC COMPOSITION AND CERAMIC WIRING BOARD

(75) Inventors: Hakuo Kataoka, Tokyo (JP); Keizo Kawamura, Tokyo (JP); Akitoshi Wagawa, Tokyo (JP)

(73) Assignee: Taiyo Yuden Co., Ltd., Tokyo (JP)

(*) Notice: Subject to any disclaimer, the term of this patent is extended or adjusted under 35 U.S.C. 154(b) by 85 days.

(21) Appl. No.: 10/515,729

(22) PCT Filed: Feb. 25, 2004

(86) PCT No.: PCT/JP2004/002180

§ 371 (c)(1),
(2), (4) Date: Nov. 26, 2004

(87) PCT Pub. No.: WO2004/076380

PCT Pub. Date: Sep. 10, 2004

(65) Prior Publication Data

US 2006/0040819 A1 Feb. 23, 2006

(30) Foreign Application Priority Data

Feb. 28, 2003 (JP) .............................. 2003-052567

(51) Int. Cl.
*C04B 35/20* (2006.01)
*C04B 35/22* (2006.01)
(52) U.S. Cl. .......................... 501/108; 501/5; 501/122; 501/123; 428/210; 428/701; 428/702

(58) Field of Classification Search .................... 501/5, 501/108, 122, 123; 428/210, 701, 702
See application file for complete search history.

(56) References Cited

FOREIGN PATENT DOCUMENTS

| JP | 2000016837 | * | 1/2000 |
|---|---|---|---|
| JP | 20000086288 | * | 3/2000 |
| JP | 2000-128628 | | 5/2000 |
| JP | 2001-278657 | | 10/2001 |
| JP | 2001-348268 | | 12/2001 |
| JP | 2001348268 | * | 12/2001 |
| JP | 2003-002735 | | 1/2003 |

* cited by examiner

*Primary Examiner*—Karl Group
(74) *Attorney, Agent, or Firm*—Oblon, Spivak, McClelland, Maier & Neustadt, P.C.

(57) ABSTRACT

To provide a ceramic composition and a ceramic wiring board that can be formed by the firing at a low temperature of 1,000° C. or less, has high strength and is advantageous when electronic component regions utilizing a ceramic layer are formed thereon.

A raw ceramic material or calcined powder thereof having a composition consisting of 100 parts by mass of a main component that consists of 52 to 62% by mass of $SiO_2$, 12 to 22% by mass of MgO, and 21 to 32% by mass of CaO and 0.5 to 3 parts by mass of a boron component in terms of the oxide form is molded and fired to obtain a ceramic composition that contains a diopside crystal as a primary crystal. By forming a wiring layer with conductive material on a substrate made of the ceramic composition, a ceramic wiring board is obtained.

12 Claims, No Drawings

CERAMIC COMPOSITION AND CERAMIC WIRING BOARD

TECHNICAL FIELD

The present invention relates to a ceramic composition containing a diopside crystal ($CaMgSi_2O_6$) as a primary crystal and to a ceramic wiring board utilizing the ceramic composition.

BACKGROUND ART

Accompanying the trend toward high-frequency band of signals applied to the multi-layered ceramic wiring board in recent years, it is required to use a material selected from low-resistance metals such as copper and silver as a conductor forming a wiring layer, which must transfer signals without loss in the high-frequency regions. In the use of such low-resistance metals as conductive materials, a substrate material must be able to be baked at a low temperature of 1,000° C. or less. A ceramic composition containing a diopside crystal as a primary crystal is one of known examples of substrate materials having such characteristics.

As a ceramic composition utilizing a diopside crystal, a Japanese Patent Publication JP 2000-128628 discloses a glass ceramic composition made from 50 to 100% of crystalline glass powder and 0 to 50% of filler powder in mass percentages, in which the crystalline glass powder has a composition consisting of 40 to 65% of $SiO_2$, 10 to 20% (exclusive of 20%) of CaO, 11 to 30% of MgO, 0.5 to 10% of $Al_2O_3$, 0.01 to 1% of CuO, 0 to 25% of SrO, 0 to 25% of BaO, and 0 to 25% of ZnO, wherein a diopside is deposited as a primary crystal in a crystal form and/or a solid solution crystal form. It is described in the publication that, with the glass ceramic composition, the metal Ag co-fired to form an inner conductor is not diffused in the glass ceramic. In addition, the publication described that a multi-layered board having small dielectric loss can be made of the glass ceramic composition, being well adaptive to the electronic circuits to which the high-frequency band of signals is applied.

Further, a Japanese Patent Publication JP 2001-278657 discloses a porcelain composition baked at a low temperature containing a diopside crystal ($CaMgSi_2O_6$) as a primary crystal, being characterized with a dielectric constant $\in$ of 7 or less and a Q×f value of 10,000 GHz or more. It is described in the publication that, with the porcelain composition, a wiring board that can be baked at a temperature of 1,000° C. or less and has excellent dielectric characteristics in the high frequency regions can be obtained.

However, in the case of the technology as disclosed in JP 2000-128628, there arise problems in a fact that crystalline glass powder used as a raw material elevates the cost and a fact that it is not easy to handle. Further, a relatively high CaO content results in formation of forsterite crystal as a side product, which tends to cause a reduction in strength.

Further, in the technology as disclosed in JP 2001-278657, formation of side products such as wollastonite crystal and forsterite crystal tends to cause a reduction in strength. Furthermore, when a ceramic layer is utilized for the electronic component region forming a capacitor, a filter and the like, the higher dielectric constant copes with downsizing. In this case, however, the dielectric constant is 7 or less, so that it is difficult to obtain the one having a small size with good properties. Thus, it has been difficult to meet the requirement of high integration.

DISCLOSURE OF THE INVENTION

It is therefore an object of the present invention to provide a ceramic composition and a ceramic wiring board that can be formed by the firing at a low temperature of 1,000° C. or less, has high strength, and is therefore advantageous for the formation of electronic component regions utilizing a ceramic layer.

To achieve the above-mentioned object, the present invention provides a ceramic composition comprising a diopside crystal, the diopside crystal being formed as a primary crystal from a composition comprising 100 parts by mass of a main component that consists of 52 to 62% by mass of $SiO_2$, 12 to 22% by mass of MgO, and 21 to 32% by mass of CaO and 0.5 to 3 parts by mass of a boron component in terms of the oxide form.

Since the ceramic composition of the present invention is made from the above-mentioned composition, firing at a low temperature can form it depositing the diopside crystal as a primary crystal. Further, since it has a high content of the diopside crystal, the obtainable ceramic composition exhibits high strength. In addition, since the dielectric constant of the ceramic composition of the present invention is in a moderate range, it has the characteristics suitable for forming electronic component regions utilizing a ceramic layer while maintaining the characteristics suitable for an electric circuit board to which signals in high-frequency regions are applied.

It is preferable that the diopside crystal is formed as a primary crystal from the composition further comprising 0.1 to 1 part by mass of an alkali metal component in terms of the oxide form. With this embodiment, it can be effectively achieved to lower the firing temperature as well as to compact the texture.

Further, it is preferable that the diopside crystal is formed as a primary crystal from the composition further comprising at least one component selected from the group consisting of 0.1 to 4 parts by mass of a zinc component, 0.1 to 1 parts by mass of a copper component, 0.1 to 5 parts by mass of a cobalt component, and 0.1 to 0.5 parts by mass of a silver component in terms of the respective oxide form.

With this embodiment, while improving the effect of the firing at a low temperature, it can diminish the deterioration due to the boron component of binder's characteristics in molding a green sheet or the like.

Further, it is preferable that the dielectric constant $\epsilon$ be greater than 7 ($\epsilon > 7$). This feature of the ceramic composition contributes to make it be in a small size with good properties, which is suitable for forming electronic component regions such as those of capacitors utilizing a ceramic layer.

The present invention further provides a ceramic wiring board comprising a ceramic layer, the ceramic layer being made from a composition comprising 100 parts by mass of a main component that consists of 52 to 62% by mass of $SiO_2$, 12 to 22% by mass of MgO, and 21 to 32% by mass of CaO and 0.5 to 3 parts by mass of a boron component in terms of the oxide form such that the ceramic layer comprises the diopside crystal as a primary crystal, and a wiring layer, the wiring layer being formed with a conductive material and being laminated by the ceramic layer.

Since the ceramic wiring board of the present invention includes the ceramic layer that is made from the above-mentioned composition, firing at a low temperature can form it depositing the diopside crystal as a primary crystal, such that a wiring layer can be formed using a conductive material selected from low-resistance metals such as silver, copper or the like. Further, since it has a high content of the diopside crystal, the obtainable ceramic wiring board exhibits high strength. In addition, since the dielectric constant of the ceramic layer is in a moderate range, the ceramic wiring board of the present invention has the characteristics suitable for forming electronic component regions utilizing the ceramic layer while maintaining the characteristics suitable for an electric circuit board to which signals in high-frequency regions are applied.

In the ceramic wiring board of the present invention, the ceramic layer is preferably made from a composition further comprising 0.1 to 1 part by mass of an alkali metal component in terms of the oxide form.

Also, the ceramic layer is preferably made from a composition further comprising at least one component selected from the group consisting of 0.1 to 4 parts by mass of a zinc component, 0.1 to 1 parts by mass of a copper component, 0.1 to 5 parts by mass of a cobalt component, and 0.1 to 0.5 parts by mass of a silver component in terms of the respective oxide form.

Further, a dielectric constant $\epsilon$ of the ceramic layer is preferably greater than 7, $\epsilon > 7$.

The effects given by the preferable embodiments described in the three paragraphs above are the same as the respective effects of the above-mentioned ceramic composition.

It is preferable that the ceramic wiring board of the present invention further comprises a component region that is formed utilizing the ceramic layer. This is because the ceramic wiring board of the present invention exhibits dielectric constant in a moderate range, and hence this feature contributes to make it be in a small size with good properties for forming electronic components thereon while maintaining the characteristics suitable for an electric circuit board to which signals in high-frequency regions are applied.

BEST MODE FOR CARRYING OUT THE INVENTION

As materials of $SiO_2$, MgO, and CaO, which make the main component of the ceramic composition of the present invention, nonglass ceramic powder such as oxides, or carbonates can be used. In particular, oxides are used preferably.

The blending ratio of $SiO_2$, MgO, and CaO in 100 parts by mass of the main component of the ceramic composition is adjusted such that $SiO_2$ is 52 to 62% by mass, MgO is 12 to 22% by mass, and CaO is 21 to 32% by mass.

If $SiO_2$ is more than 62% by mass, a wollastonite crystal is produced, which results in an increase in dielectric loss and a reduction in strength. On the other hand, if $SiO_2$ is less than 52% by mass, an akermanite crystal is produced, resulting in an increase in dielectric loss.

If MgO is more than 22% by mass, a forsterite crystal is produced, resulting in a reduction in strength. On the other hand, if MgO is less than 12% by mass, a wollastonite crystal is produced, resulting in an increase in dielectric loss.

If CaO is more than 32% by mass, wollastonite and akermanite crystals are produced, resulting in an increase in dielectric loss and a reduction in strength. On the other hand, if CaO is less than 21% by mass, a forsterite crystal is produced, resulting in a reduction in strength.

Further, as for materials of side components, i.e., a boron component, an alkali metal component, a zinc component, a copper component, a cobalt component and a silver component, the forms of oxide, carbonate, acetate, nitrate, fluoride, as well as the elemental metal, can be used. Alternatively glasses having the above-mentioned composition may be used in combination at the above blending ratio. Preferably, oxides are used.

Among the above-mentioned side components, the boron component is indispensable for decreasing the firing temperature and is added in an amount such that the boron component is 0.5 to 3 parts by mass in terms of the oxide form per 100 parts by mass of the main component consisting of $SiO_2$, MgO, and CaO.

If the boron component is less than 0.5 parts by mass, it becomes difficult to form the ceramic composition by the firing at 1,000° C. or less while if it is more than 3 parts by mass, fusion occurs at the time of firing, resulting in the difficulties in stabilization of the shape of the sintered body and in a reduction in binding ability of a binder at the time of molding a green sheet or the like, thus worsening workability.

Among the above-mentioned components, the alkali metal component, zinc component, copper component, cobalt component and silver component are not necessarily requisite, but they may be preferably added in order to effectively accomplish lowering of the firing temperature as well as compacting the texture, so as to improve the effect of the firing at a low temperature.

Of these components, Li, Na, and K, for example, can be used as the alkali metal component. In particular, Li is preferable. The alkali metal component is added in an amount of preferably 0.1 to 1 part by mass in terms of the oxide form per 100 parts by mass of the above-mentioned main component. If the alkali metal component is less than 0.1 parts by mass, the effect of adding it is poor while if the alkali metal component is more than 1 part by mass, fusion occurs at the time of firing, resulting in the difficulties in stabilization of the shape of the sintered body and the deterioration in characteristics in the insulation ability.

The zinc component is added in an amount of preferably 0.1 to 4 parts by mass in terms of the oxide form per 100 parts by mass of the above-mentioned main component. If the zinc component is less than 0.1 parts by mass, the effect of the adding is poor while if the zinc component is more than 4 parts by mass, the dielectric loss is increased.

The copper component is added in an amount of preferably 0.1 to 1 part by mass in terms of the oxide form per 100 parts by mass of the above-mentioned main component. If the copper component is less than 0.1 parts by mass, the effect of the adding is poor while if the copper component is more than 1 part by mass, the dielectric loss is increased.

The cobalt component is added in an amount of preferably 0.1 to 5 parts by mass in terms of the oxide form per 100 parts by mass of the above-mentioned main component. If the cobalt component is less than 0.1 parts by mass, the effect of the adding is poor while if the cobalt component is more than 5 parts by mass, the dielectric loss is increased.

The silver component is added in an amount of preferably 0.1 to 0.5 parts by mass in terms of the oxide form per 100 parts by mass of the above-mentioned main component. If the silver component is less than 0.1 parts by mass, the effect of the adding is poor while if the silver component is more than 0.5 parts by mass, the dielectric loss is increased.

The ceramic composition of the present invention may contain other components than the above components unless the characteristic is impaired. For example, it is possible to contain $Al_2O_3$ in an amount of 1.5 parts by mass or less per 100 parts by mass of the above-mentioned main component. Here, if $Al_2O_3$ content exceeds 1.5 parts by mass, a dielectric loss increases.

The ceramic composition of the present invention can be produced by taking steps of adding binders, plasticizers, solvents or the like as necessary to the raw ceramic material containing the above-mentioned composition consisting of a main component and side component(s), molding the mixture into a predetermined shape and firing it. Note that the above-mentioned ceramic raw material is preferably calcined before the use.

The binders include, for example, polyvinyl butyral resins, and methacrylic acid resins. The plasticizers that can be used include, for example, dibutyl phthalate and dioctyl phthalate. Examples of the solvents that can be used include toluene and methyl ethyl ketone.

The molding may include formation of a block body by using a known press method, formation of green sheets by using a known doctor blade method followed by adheringly pressing to form a multilayer body, and formation of paste followed by making a multiple-layered body by using a thick film printing technology. To form a wiring board, molding green sheets is preferable since they are easy to be multiple-layered.

To form a wiring board, first a raw material powder containing the above-mentioned raw ceramic material or a calcined powder thereof is formed into a green sheet by using a known doctor blade method. On the green sheet, a wiring layer is printed by a screen-printing method using a conductive paste. Then the green sheet with wiring layer is adheringly pressed to form a multilayer body. After binder portion of the body is removed, the multilayer body formed from the green sheet with wiring layer is fired at a low temperature, e.g., at 1,000° C. or less (preferably 850 to 1,000° C.) to obtain the intended wiring board that is formed by the low-temperature firing. Note that firing is performed in atmospheric air when Ag is used for the wiring layer or in a non-oxidizing atmosphere when Cu is used for the wiring layer.

According to the present invention, since the raw ceramic material is mixed in a ratio close to the stoichiometric compositional ratio of diopside, the ceramic composition obtainable contains as a primary crystal a diopside crystal with extremely small amounts of side product of other crystals. Note that the content of the diopside crystal in the ceramic composition of the present invention is preferably 95% by mass or more, and more preferably 99% by mass or more.

Further, since the ceramic composition of the present invention contains as a primary crystal the diopside crystal and has low contents of side product of other crystals, it does not cause an increase in dielectric loss. In addition, it exhibits a moderate dielectric constant so as to have good characteristics suitable for forming electronic component regions utilizing a ceramic layer. Note that the dielectric constant, $\epsilon$, of the ceramic composition of the present invention is preferably $\epsilon>7$, more preferably $10>\epsilon>7$.

The ceramic wiring board of the present invention comprises a ceramic layer that contains as a primary crystal the diopside crystal and a wiring layer made of a conductive material laminated by the ceramic layer. That is, the wiring layer is formed between the ceramic layers and/or on the surface of the outermost ceramic layer.

In the ceramic wiring board of the present invention, the electronic components utilizing the ceramic layer include, for example, capacitors, and filters. By setting the dielectric constant, $\epsilon$, of the ceramic layer to $\epsilon>7$, the electronic components can be formed in small size with good characteristics.

EXAMPLES

Example 1

Powders of $SiO_2$, $CaCO_3$, $MgO$, $Al_2O_3$, $B_2O_3$, $Li_2CO_3$, $ZnO$, $CuO$, $Co_2O_3$, and $Ag_2O$ were weighed in ratio shown in each row of Table 1 and mixed by a wet process for 15 hours, and then dried at 120° C. The dried powder was calcined in atmospheric air at 700° C. for 2 hours.

An appropriate amount of PVA binder was added to the calcined product and the mixture was granulated, press molded, and subjected to the binder-removing treatment at 500° C. in atmospheric air to obtain the formed substrate.

The above-mentioned formed substrate was fired in atmospheric air at 850 to 1,000° C. for 2 hours to obtain each of sintered products of Sample Nos. 1 to 43 shown in Table 2.

Of each sintered product shown in Table 2, relative density, transverse strength according to JIS R1601, and dielectric constant and dielectric loss at a resonant frequency (10 to 15 GHz) according to JIS R1627 were measured. The dielectric loss was converted to a value at 10 GHz assuming that (frequency)×(1/dielectric loss)=(constant). Further, the crystal phases in the sintered products were identified by X-ray diffraction. The results are also shown in Table 2.

TABLE 1

| Sample No. | Main component (mass %) | | | Side component (part by mass per 100 parts by mass of main component) | | | | | | |
|---|---|---|---|---|---|---|---|---|---|---|
| | $SiO_2$ | $CaCO_3$ ** | MgO | $Al_2O_3$ | $B_2O_3$ | $Li_2CO_3$ ** | ZnO | CuO | $Co_2O_3$ | $Ag_2O$ |
| * 1 | 55.5 | 26.0 | 18.5 | 0 | 0 | 0 | 0 | 0 | 0 | 0 |
| 2 | 55.5 | 26.0 | 18.5 | 0 | 0.5 | 0.1 | 0 | 0 | 0 | 0 |
| 3 | 55.5 | 26.0 | 18.5 | 0 | 1.0 | 0 | 0 | 0 | 0 | 0 |
| 4 | 55.5 | 26.0 | 18.5 | 0 | 3.0 | 0 | 0 | 0 | 0 | 0 |
| * 5 | 55.5 | 26.0 | 18.5 | 0 | 4.0 | 0 | 0 | 0 | 0 | 0 |
| 6 | 55.5 | 26.0 | 18.5 | 1.5 | 1.5 | 0 | 0 | 0 | 0 | 0 |
| * 7 | 55.5 | 26.0 | 18.5 | 3.0 | 1.5 | 0 | 0 | 0 | 0 | 0 |
| 8 | 55.5 | 26.0 | 18.5 | 0 | 1.5 | 0.5 | 0 | 0 | 0 | 0 |
| 9 | 55.5 | 26.0 | 18.5 | 0 | 1.5 | 1.0 | 0 | 0 | 0 | 0 |
| * 10 | 55.5 | 26.0 | 18.5 | 0 | 1.5 | 1.5 | 0 | 0 | 0 | 0 |
| 11 | 55.5 | 26.0 | 18.5 | 0 | 1.5 | 0 | 2.0 | 0 | 0 | 0 |
| 12 | 55.5 | 26.0 | 18.5 | 0 | 1.5 | 0 | 4.0 | 0 | 0 | 0 |
| * 13 | 55.5 | 26.0 | 18.5 | 0 | 1.5 | 0 | 5.0 | 0 | 0 | 0 |
| 14 | 55.5 | 26.0 | 18.5 | 0 | 1.5 | 0 | 0 | 0.5 | 0 | 0 |

TABLE 1-continued

| Sample No. | Main component (mass %) | | | Side component (part by mass per 100 parts by mass of main component) | | | | | | |
|---|---|---|---|---|---|---|---|---|---|---|
| | $SiO_2$ | $CaCO_3$ ** | MgO | $Al_2O_3$ | $B_2O_3$ | $Li_2CO_3$ ** | ZnO | CuO | $Co_2O_3$ | $Ag_2O$ |
| 15 | 55.5 | 26.0 | 18.5 | 0 | 1.5 | 0 | 0 | 1.0 | 0 | 0 |
| * 16 | 55.5 | 26.0 | 18.5 | 0 | 1.5 | 0 | 0 | 1.5 | 0 | 0 |
| 17 | 55.5 | 26.0 | 18.5 | 0 | 1.5 | 0 | 0 | 0 | 3 | 0 |
| 18 | 55.5 | 26.0 | 18.5 | 0 | 1.5 | 0 | 0 | 0 | 5 | 0 |
| * 19 | 55.5 | 26.0 | 18.5 | 0 | 1.5 | 0 | 0 | 0 | 7 | 0 |
| 20 | 55.5 | 26.0 | 18.5 | 0 | 1.5 | 0 | 0 | 0 | 0 | 0.1 |
| 21 | 55.5 | 26.0 | 18.5 | 0 | 1.5 | 0 | 0 | 0 | 0 | 0.5 |
| * 22 | 55.5 | 26.0 | 18.5 | 0 | 1.5 | 0 | 0 | 0 | 0 | 1.0 |
| 23 | 55.5 | 26.0 | 18.5 | 1.5 | 2.0 | 0.5 | 0 | 0 | 0 | 0 |
| 24 | 55.5 | 26.0 | 18.5 | 1.5 | 2.0 | 0.5 | 4.0 | 0 | 0 | 0 |
| 25 | 55.5 | 26.0 | 18.5 | 1.5 | 2.0 | 0.5 | 4.0 | 1.0 | 3.0 | 0.3 |
| * 26 | 65.0 | 21.0 | 14.0 | 1.5 | 2.0 | 0.5 | 4.0 | 1.0 | 3.0 | 0.3 |
| * 27 | 65.0 | 24.0 | 11.0 | 1.5 | 2.0 | 0.5 | 4.0 | 1.0 | 3.0 | 0.3 |
| 28 | 62.0 | 21.0 | 17.0 | 1.5 | 2.0 | 0.5 | 4.0 | 1.0 | 3.0 | 0.3 |
| 29 | 62.0 | 24.0 | 14.0 | 1.5 | 2.0 | 0.5 | 4.0 | 1.0 | 3.0 | 0.3 |
| 30 | 59.0 | 23.5 | 17.5 | 1.5 | 2.0 | 0.5 | 4.0 | 1.0 | 3.0 | 0.3 |
| * 31 | 55.5 | 18.5 | 26.0 | 1.5 | 2.0 | 0.5 | 4.0 | 1.0 | 3.0 | 0.3 |
| * 32 | 55.5 | 20.0 | 24.5 | 1.5 | 2.0 | 0.5 | 4.0 | 1.0 | 3.0 | 0.3 |
| 33 | 55.5 | 22.0 | 22.5 | 1.5 | 2.0 | 0.5 | 4.0 | 1.0 | 3.0 | 0.3 |
| 34 | 55.5 | 24.0 | 20.5 | 1.5 | 2.0 | 0.5 | 4.0 | 1.0 | 3.0 | 0.3 |
| 35 | 55.5 | 28.0 | 16.5 | 1.5 | 2.0 | 0.5 | 4.0 | 1.0 | 3.0 | 0.3 |
| 36 | 55.5 | 32.0 | 12.5 | 1.5 | 2.0 | 0.5 | 4.0 | 1.0 | 3.0 | 0.3 |
| * 37 | 55.5 | 34.0 | 10.5 | 1.5 | 2.0 | 0.5 | 4.0 | 1.0 | 3.0 | 0.3 |
| * 38 | 52.0 | 33.5 | 14.5 | 1.5 | 2.0 | 0.5 | 4.0 | 1.0 | 3.0 | 0.3 |
| 39 | 52.0 | 32.0 | 16.0 | 1.5 | 2.0 | 0.5 | 4.0 | 1.0 | 3.0 | 0.3 |
| 40 | 52.0 | 30.5 | 17.5 | 1.5 | 2.0 | 0.5 | 4.0 | 1.0 | 3.0 | 0.3 |
| * 41 | 49.0 | 33.5 | 17.5 | 1.5 | 2.0 | 0.5 | 4.0 | 1.0 | 3.0 | 0.3 |
| * 42 | 49.0 | 32.0 | 19.0 | 1.5 | 2.0 | 0.5 | 4.0 | 1.0 | 3.0 | 0.3 |
| * 43 | 49.0 | 30.5 | 20.5 | 1.5 | 2.0 | 0.5 | 4.0 | 1.0 | 3.0 | 0.3 |

The mark * indicates ones outside the scope of the present invention.
The mark ** indicates the amount shown in terms of the oxide form.

TABLE 2

| Sample No. | Firing temperature (° C.) | Relative density (%) | Dielectric constant | Dielectric loss ($\times 10^{-4}$) | Transverse strength (MPa) | Crystal phase |
|---|---|---|---|---|---|---|
| * 1 | 1000 | No sintering | — | — | — | — |
| 2 | 1000 | 97 | 7.5 | 4 | 303 | Di |
| 3 | 1000 | 98 | 7.6 | 5 | 317 | Di |
| 4 | 950 | 97 | 7.8 | 7 | 315 | Di |
| * 5 | 900 | Fusion | — | — | — | — |
| 6 | 1000 | 99 | 7.3 | 6 | 316 | Di |
| * 7 | 950 | 99 | 7.2 | 13 | 294 | Di |
| 8 | 950 | 98 | 7.5 | 5 | 299 | Di |
| 9 | 900 | 98 | 7.5 | 5 | 282 | Di |
| * 10 | 900 | Fusion | — | — | — | — |
| 11 | 1000 | 97 | 7.7 | 5 | 307 | Di |
| 12 | 950 | 97 | 7.9 | 5 | 294 | Di |
| * 13 | 950 | 99 | 8.0 | 11 | 329 | Di, $Zn_2SiO_4$ |
| 14 | 1000 | 97 | 7.6 | 5 | 292 | Di |
| 15 | 1000 | 99 | 7.8 | 7 | 303 | Di |
| * 16 | 1000 | 99 | 7.8 | 12 | 323 | Di |
| 17 | 1000 | 97 | 7.6 | 5 | 296 | Di |
| 18 | 1000 | 99 | 7.6 | 8 | 284 | Di |
| * 19 | 1000 | 99 | 7.8 | 13 | 295 | Di |
| 20 | 1000 | 98 | 7.6 | 6 | 298 | Di |
| 21 | 1000 | 99 | 7.7 | 8 | 312 | Di |
| * 22 | 1000 | 99 | 7.6 | 11 | 303 | Di |
| 23 | 900 | 97 | 7.6 | 8 | 297 | Di |
| 24 | 900 | 99 | 8.0 | 7 | 304 | Di |
| 25 | 900 | 99 | 8.3 | 7 | 315 | Di |
| * 26 | 900 | 99 | 7.2 | 14 | 259 | Di, Q, W |
| * 27 | 900 | 98 | 7.1 | 12 | 294 | Di, Q, W |
| 28 | 900 | 97 | 8.1 | 9 | 308 | Di |
| 29 | 900 | 98 | 8.0 | 7 | 302 | Di |
| 30 | 900 | 98 | 8.2 | 8 | 340 | Di |
| * 31 | 900 | 99 | 7.6 | 9 | 265 | Di, Fo |
| * 32 | 900 | 99 | 7.8 | 10 | 271 | Di, Fo |
| 33 | 900 | 97 | 8.2 | 7 | 328 | Di |

TABLE 2-continued

| Sample No. | Firing temperature (° C.) | Relative density (%) | Dielectric constant | Dielectric loss (×10⁻⁴) | Transverse strength (MPa) | Crystal phase |
|---|---|---|---|---|---|---|
| 34 | 900 | 98 | 8.3 | 7 | 327 | Di |
| 35 | 900 | 97 | 8.2 | 8 | 329 | Di |
| 36 | 900 | 99 | 8.1 | 8 | 327 | Di |
| *37 | 900 | 97 | 7.4 | 15 | 268 | Di, W, Ak |
| *38 | 900 | 99 | 7.6 | 13 | 256 | Di, W, Ak |
| 39 | 900 | 98 | 8.2 | 7 | 329 | Di |
| 40 | 900 | 97 | 8.1 | 7 | 298 | Di |
| *41 | 900 | 97 | 8.2 | 11 | 315 | Di, Ak |
| *42 | 900 | 98 | 8.2 | 13 | 285 | Di, Ak |
| *43 | 900 | 99 | 8.3 | 13 | 338 | Di, Ak |

Crystal Phase
Di: Diopside ($CaMgSi_2O_6$), Ak: Akermanite ($Ca_2Mg_2Si_2O_7$), W: Wollastonite ($CaSiO_3$), Fo: Forsterite ($Mg_2SiO_4$), Q: Quartz ($SiO_2$)

As a result, all the ceramic compositions falling in the scope of the present invention (not marked by *) were sintered at 1,000° C. or less, and each had dielectric losse as low as $1.0 \times 10^3$ or less, and a transverse strength of 280 MPa or more.

In contrast, it is shown that the ceramic compositions outside the scope of the present invention (marked by *) arise problems including the facts that they did not sinter, that they have too high dielectric losses, or that they are weak in transverse strength.

Based on the products in the above, results indicate the followings in respect of the blending ratio of the respective elements in the ceramic composition.

When $SiO_2$ is more than 62% by mass, wollastonite is produced, resulting in an increase in dielectric loss and a reduction in strength (see No. 26). On the other hand, if $SiO_2$ is less than 52% by mass, akermanite is produced, resulting in an increase in dielectric loss (see Nos. 42 and 43).

When MgO is more than 22% by mass, forsterite is produced, resulting in a reduction in strength (see Nos. 31 and 32). On the other hand, when MgO is less than 12% by mass, wollastonite is produced, resulting in an increase in dielectric loss (see Nos. 27 and 37).

When CaO is more than 32% by mass, wollastonite and akermanite are produced, resulting in an increase in dielectric loss and a reduction in strength (see Nos. 37 and 38). On the other hand, if CaO is less than 21% by mass, forsterite is produced, resulting in a reduction in strength (see No. 31).

When $Al_2O_3$ is more than 1.5 parts by mass, dielectric loss is increased (see No. 6).

When $B_2O_3$ is less than 0.5 parts by mass, the sintered product is not formed at 1,000° C. (see No. 1). On the other hand, when $B_2O_3$ is more than 3 parts by mass, fusion occurs at the time of firing at 900° C., resulting in the difficulties in stabilization of the shape of the sintered product (see No. 5).

When $Li_2O$ is more than 1 part by mass, fusion occurs at the time of firing at 900° C., resulting in the difficulties in stabilization of the shape of the sintered product (see No. 10).

When ZnO is more than 4 parts by mass, $Zn_2SiO_4$ is produced, resulting in an increase in dielectric loss (see No. 13).

When CuO is more than 1 part by mass, dielectric loss is increased (see No. 16).

When $Co_2O_3$ is more than 5 parts by mass, dielectric loss is increased (see No. 19).

When $Ag_2O$ is more than 0.5 parts by mass, dielectric loss is increased (see No. 22).

Note that the composition can be sintered at 1,000° C. without addition of any of $Al_2O_3$, $Li_2CO_3$, ZnO, CuO, $Co_2O_3$, and $Ag_2O$. However, their addition brings about the effect in lowering the sintering temperature. So it is apparent that each element may preferably be added in the above-mentioned range of amount.

Example 2

Powders of $SiO_2$, $CaCO_3$, and MgO were weighed in ratio shown in each row of Table 3 and mixed by a wet process for 15 hours, and then dried at 120° C. The dried powder was calcined in atmospheric air at 1,100° C. for 2 hours. Powders of $Al_2O_3$, $B_2O_3$, $Li_2Co_3$, ZnO, CuO, $Co_2O_3$, and $Ag_2O$ were weighed in ratio shown in each respective row of Table 3 and added to the calcined product by a wet process for 15 hours, and the resulting mixture was dried at 120° C.

TABLE 3

| Sample No. | Main component (mass %) | | | Side component (part by mass per 100 parts by mass of main component) | | | | | |
|---|---|---|---|---|---|---|---|---|---|
| | $SiO_2$ | $CaCO_3$ * | MgO | $Al_2O_3$ | $B_2O_3$ | $Li_2CO_3$ * | ZnO | CuO | $Ag_2O$ |
| 44 | 55.5 | 26.0 | 18.5 | 0 | 2.0 | 0 | 0 | 0 | 0 |
| 45 | 55.5 | 26.0 | 18.5 | 0 | 3.0 | 0 | 0 | 0 | 0 |
| 46 | 55.5 | 26.0 | 18.5 | 0 | 1.5 | 1.0 | 0 | 0 | 0 |
| 47 | 55.5 | 26.0 | 18.5 | 0 | 1.5 | 0 | 4.0 | 0 | 0 |
| 48 | 55.5 | 26.0 | 18.5 | 0 | 1.5 | 0 | 0 | 1.0 | 0 |
| 49 | 55.5 | 26.0 | 18.5 | 1.5 | 2.0 | 0.5 | 0 | 0 | 0 |
| 50 | 55.5 | 26.0 | 18.5 | 1.5 | 2.0 | 0.5 | 4.0 | 0 | 0 |

TABLE 3-continued

| Sample No. | Main component (mass %) | | | Side component (part by mass per 100 parts by mass of main component) | | | | | |
|---|---|---|---|---|---|---|---|---|---|
| | SiO$_2$ | CaCO$_3$ * | MgO | Al$_2$O$_3$ | B$_2$O$_3$ | Li$_2$CO$_3$ * | ZnO | CuO | Ag$_2$O |
| 51 | 55.5 | 26.0 | 18.5 | 1.5 | 2.0 | 0.5 | 4.0 | 1.0 | 0.3 |
| 52 | 52.0 | 32.0 | 16.0 | 1.5 | 2.0 | 0.5 | 4.0 | 1.0 | 0.3 |
| 53 | 62.0 | 24.0 | 14.0 | 1.5 | 2.0 | 0.5 | 4.0 | 1.0 | 0.3 |

The mark * indicates the amount shown in terms of the oxide form.

The dried mixture of powders was molded, fired and evaluated in the same manner as in Example 1. The results of evaluation are shown in Table 4. Each of the samples was sintered at 1,000° C. or less. They also exhibit dielectric loss as low as 1.0×10$^3$ or less and transverse strength of 280 MPa or more. That is, it is clear that within the above-mentioned ranges in respect of the amount of element composed in the composition, the process in which the main component is calcined before the addition of side components can also bring similar effects.

TABLE 4

| Sample No. | Firing temperature (° C.) | Relative density (%) | Dielectric constant | Dielectric loss (×10$^{-4}$) | Transverse strength (MPa) | Crystal phase |
|---|---|---|---|---|---|---|
| 44 | 1000 | 97 | 7.7 | 5 | 282 | Di |
| 45 | 950 | 98 | 7.9 | 6 | 294 | Di |
| 46 | 900 | 98 | 7.4 | 6 | 315 | Di |
| 47 | 950 | 98 | 7.9 | 5 | 327 | Di |
| 48 | 1000 | 99 | 7.9 | 5 | 339 | Di |
| 49 | 900 | 97 | 7.5 | 7 | 299 | Di |
| 50 | 900 | 98 | 8.1 | 8 | 281 | Di |
| 51 | 900 | 99 | 8.3 | 7 | 291 | Di |
| 52 | 900 | 99 | 8.4 | 7 | 339 | Di |
| 53 | 900 | 99 | 7.9 | 8 | 302 | Di |

Crystal phase Di: Diopside (CaMgSi$_2$O$_6$)

INDUSTRIAL APPLICABILITY

As described above, according to the ceramic composition and/or the ceramic wiring board utilizing the same in the present invention, since they are made from the composition comprising 100 parts by mass of a main component that consists of 52 to 62% by mass of SiO$_2$, 12 to 22% by mass of MgO, and 21 to 32% by mass of CaO and 0.5 to 3 parts by mass of a boron component in terms of the oxide form, the ceramic composition as well as the ceramic wiring board, both depositing the diopside crystal as a primary crystal, can be formed by the firing at a low temperature as low as 1,000° C. or less, which enables use of low-resistance metals such as silver and copper as conductive materials. Further, since the content of the diopside crystal is high, the obtainable ceramic product exhibits high strength. Furthermore, since the dielectric constant of the obtainable ceramic product is in a moderate range, it has the characteristics suitable for forming electronic component regions utilizing a ceramic layer while maintaining the characteristics suitable for an electric circuit board to which signals in high-frequency regions are applied.

The invention claimed is:

1. A ceramic composition comprising a diopside crystal, the diopside crystal being formed as a primary crystal from a composition comprising 100 parts by mass of a main component that consists of 52 to 62% by mass of SiO$_2$, 12 to 22% by mass of MgO, and 21 to 32% by mass of CaO, 0.5 to 3 parts by mass of a boron component, and 0.1 to 1 part by mass of an alkali metal component, in terms of the oxide form.

2. The ceramic composition according to claim 1, the diopside crystal being formed as a primary crystal from the composition further comprising at least one component selected from the group consisting of 0.1 to 4 parts by mass of a zinc component, 0.1 to 1 parts by mass of a copper component, 0.1 to 5 parts by mass of a cobalt component, and 0.1 to 0.5 parts by mass of a silver component in terms of the respective oxide form.

3. The ceramic composition according to claim 1, wherein a dielectric constant $\epsilon$ is greater than 7.

4. A ceramic wiring board comprising a ceramic layer, the ceramic layer being made from a composition comprising 100 parts by mass of a main component that consists of 52 to 62% by mass of SiO$_2$, 12 to 22% by mass of MgO, and 21 to 32% by mass of CaO, 0.5 to 3 parts by mass of a boron component, and 0.1 to 1 part by mass of an alkali metal component, in terms of the oxide form such that the ceramic layer comprises the diopside crystal as a primary crystal, and a wiring layer, the wiring layer being formed with a conductive material and being laminated by the ceramic layer.

5. The ceramic wiring board according to claim 4, the ceramic layer being made from the composition further comprising at least one component selected from the group consisting of 0.1 to 4 parts by mass of a zinc component, 0.1 to 1 parts by mass of a copper component, 0.1 to 5 parts by mass of a cobalt component, and 0.1 to 0.5 parts by mass of a silver component in terms of the respective oxide form.

6. The ceramic wiring board according to claim 4, wherein a dielectric constant $\epsilon$ of the ceramic layer is greater than 7.

7. The ceramic wiring board according to claim 4, further comprising a component region, the component region being formed utilizing the ceramic layer.

8. A ceramic composition comprising a diopside crystal, the diopside crystal being formed as a primary crystal from a composition comprising 100 parts by mass of a main component that consists of 52 to 62% by mass of $SiO_2$, 12 to 22% by mass of MgO, and 21 to 32% by mass of CaO and 0.5 to 3 parts by mass of a boron component in terms of the oxide form, further comprising at least one component selected from the group consisting of 0.1 to 1 parts by mass of a copper component, 0.1 to 5 parts by mass of a cobalt component, and 0.1 to 0.5 parts by mass of a silver component in terms of the respective oxide form.

9. A ceramic wiring board comprising a ceramic layer, the ceramic layer being made from the ceramic composition according to claim 8, such that the ceramic layer comprises the diopside crystal as a primary crystal, and a wiring layer, the wiring layer being formed with a conductive material and being laminated by the ceramic layer.

10. A ceramic composition comprising a diopside crystal, the diopside crystal being formed as a primary crystal from a composition comprising 100 parts by mass of a main component that consists of 52 to 62% by mass of $SiO_2$, 12 to 22% by mass of MgO, and 21 to 32% by mass of CaO and 0.5 to 3 parts by mass of a boron component in terms of the oxide form, wherein the sintered product of said composition has a transverse strength according to JIS R1601 of at least 280 MPa, and a dielectric loss at a resonant frequency of 10 to 15 GHz according to JIS R1627, converted to a value at 10 GHz, of no higher than $1.0 \times 10^3$, wherein the content of said diopside crystal is at least 95% by mass, of the composition.

11. A ceramic wiring board comprising a ceramic layer, the ceramic layer being made from the ceramic composition according to claim 10, such that the ceramic layer comprises the diopside crystal as a primary crystal, and a wiring layer, the wiring layer being formed with a conductive material and being laminated by the ceramic layer.

12. The ceramic composition according to claim 10, wherein the content of said diopside crystal is at least 99% by mass, of the composition.

* * * * *